US009853636B2

(12) United States Patent
Ohmi et al.

(10) Patent No.: US 9,853,636 B2
(45) Date of Patent: Dec. 26, 2017

(54) SEMICONDUCTOR APPARATUS

(71) Applicant: SOCIONEXT INC., Yokohama-shi, Kanagawa (JP)

(72) Inventors: Hajime Ohmi, Anjo (JP); Osamu Uno, Kasugai (JP); Masahiro Iwamoto, Kasugai (JP); Yuichi Itonaga, Obu (JP)

(73) Assignee: SOCIONEXT INC., Yokohama (JP)

( * ) Notice: Subject to any disclaimer, the term of this patent is extended or adjusted under 35 U.S.C. 154(b) by 250 days.

(21) Appl. No.: 14/741,911

(22) Filed: Jun. 17, 2015

(65) Prior Publication Data

US 2016/0013786 A1 Jan. 14, 2016

(30) Foreign Application Priority Data

Jul. 14, 2014 (JP) .................................. 2014-144226

(51) Int. Cl.
*H03K 17/081* (2006.01)
*H03K 19/003* (2006.01)
*H03K 19/0185* (2006.01)

(52) U.S. Cl.
CPC ................. *H03K 17/08104* (2013.01); *H03K 19/00315* (2013.01); *H03K 19/018521* (2013.01); *H03K 19/018592* (2013.01)

(58) Field of Classification Search
CPC ............ H03K 17/08104; H03K 3/012; H03K 17/0814; H03K 19/00315; H03K 19/018521; H03K 19/018592; H02H 9/044

See application file for complete search history.

(56) References Cited

U.S. PATENT DOCUMENTS

| 2008/0030232 A1 | 2/2008 | Uno |
| 2009/0140770 A1 | 6/2009 | Uno |
| 2011/0050318 A1* | 3/2011 | Lee ..................... H03F 3/45183 327/333 |

FOREIGN PATENT DOCUMENTS

| JP | 2000-260884 A | 9/2000 |
| JP | 2009-213109 A | 9/2009 |

* cited by examiner

*Primary Examiner* — Zeev V Kitov
(74) *Attorney, Agent, or Firm* — Arent Fox LLP

(57) ABSTRACT

A semiconductor apparatus includes an internal circuit connected to a first power line to which a first power voltage is applied; a transistor including a first terminal, which is connected to a node to which an input voltage is applied, a second terminal connected to the internal circuit, and a control terminal to which a control voltage is applied; and a voltage control circuit, which is connected to the node, generating the control voltage. Further, the voltage control circuit includes a step-down circuit generating an internal voltage by lowering the input voltage applied to the node, and a switching circuit, which is connected to the first power line, generating the control voltage based on the first power voltage and the internal voltage.

19 Claims, 9 Drawing Sheets

SEMICONDUCTOR APPARATUS

CROSS-REFERENCE TO RELATED APPLICATION

This application is based upon and claims the benefit of priority of the prior Japanese Patent Application No. 2014-144226, filed on Jul. 14, 2014, the entire contents of which are incorporated herein by reference.

FIELD

The embodiment discussed herein is related to a semiconductor apparatus.

BACKGROUND

Conventionally, an electronic apparatus includes a plurality of semiconductor apparatuses. In the semiconductor apparatuses, to reduce energy consumption, the drive voltage has been lowered. On the other hand, there still exist some semiconductor apparatuses where the drive voltage thereof has not been reduced or it is difficult to reduce the drive voltage. Due to this, an input/output circuit of the semiconductor apparatus includes a tolerant function to protect the circuit against the input signal having a voltage higher than a power voltage (see, for example, Japanese Laid-open Patent Publication No. 2009-213109).

SUMMARY

According to an aspect of the present invention, a semiconductor apparatus includes an internal circuit connected to a first power line to which a first power voltage is applied; a transistor including a first terminal, which is connected to a node to which an input voltage is applied, a second terminal connected to the internal circuit, and a control terminal to which a control voltage is applied; and a voltage control circuit, which is connected to the node, generating the control voltage. Further, the voltage control circuit includes a step-down circuit generating an internal voltage by lowering the input voltage applied to the node, and a switching circuit, which is connected to the first power line, generating the control voltage based on the first power voltage and the internal voltage.

The objects and advantages of the embodiments disclosed herein will be realized and attained by means of the elements and combinations particularly pointed out in the claims.

It is to be understood that both the foregoing general description and the following detailed description are exemplary and explanatory and are not restrictive of the invention as claimed.

DESCRIPTION OF EMBODIMENT

In response to a recent desire to lower energy consumption of an electronic apparatus, power supply to drive a semiconductor apparatus is cut off which is unnecessary to the operations of that time. In such a semiconductor apparatus, however, a signal having a voltage higher than power voltage may be applied to a terminal connected to another semiconductor apparatus. Further, the voltage at the terminal where such a signal is applied to may exceed the withstand voltage of a device such as a transistor which is included in an interface circuit.

Therefore, for example, it is desired to secure the withstand voltage of the transistor to which a voltage higher than the power voltage is applied.

First Embodiment

In the following, a first embodiment is described.

Figure 1:
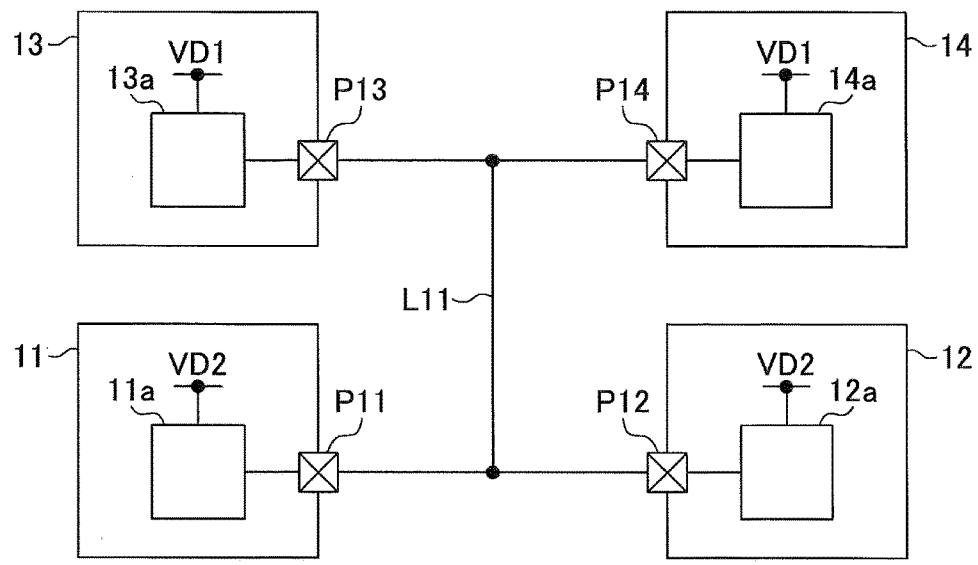
FIG. 1 is a block circuit diagram illustrating connections among plural semiconductor apparatuses.

As illustrated in FIG. 1, plural semiconductor apparatuses 11, 12, 13, and 14 include respective external terminals P11, P12, P13, and P14 (input terminals, output terminals, or input/output terminals). Those semiconductor apparatuses 11, 12, 13, and 14 are mounted on a substrate of an electronic device. The external terminals P11, P12, P13, and P14 are connected to each other via a wired line L11 on the substrate.

The semiconductor apparatuses 13 and 14 operate based on a supplied high potential voltage "VD1". The semiconductor apparatuses 11 and 12 operate based on a supplied high potential voltage "VD2". Here, the high potential voltage "VD2" is lower than the high potential voltage "VD1". The high potential voltage "VD2" is supplied or stopped by a power control circuit (not shown).

The semiconductor apparatuses 11 and 12 include interface circuits 11a and 12a which are connected to the external terminals P11 and P12, respectively. Similarly, the semiconductor apparatuses 13 and 14 include interface circuits 13a and 14a which are connected to the external terminals P13 and P14, respectively. The semiconductor apparatuses 11, 12, 13, and 14 transmit and receive signals via the interface circuits 11a, 12a, 13a, and 14a, respectively.

The semiconductor apparatuses 13 and 14 output a signal having an amplitude range of the high potential voltage "VD1" by the interface circuits 13a and 14a, respectively. The semiconductor apparatuses 11 and 12 output a signal having an amplitude range of the high potential voltage "VD2" by the interface circuits 11a and 12a, respectively. Therefore, the interface circuits 11a and 12a of the semiconductor apparatuses 11 and 12 have withstand voltage characteristics against a signal having a level of the high potential voltage "VD1". The interface circuit 11a is described.

Figure 3:
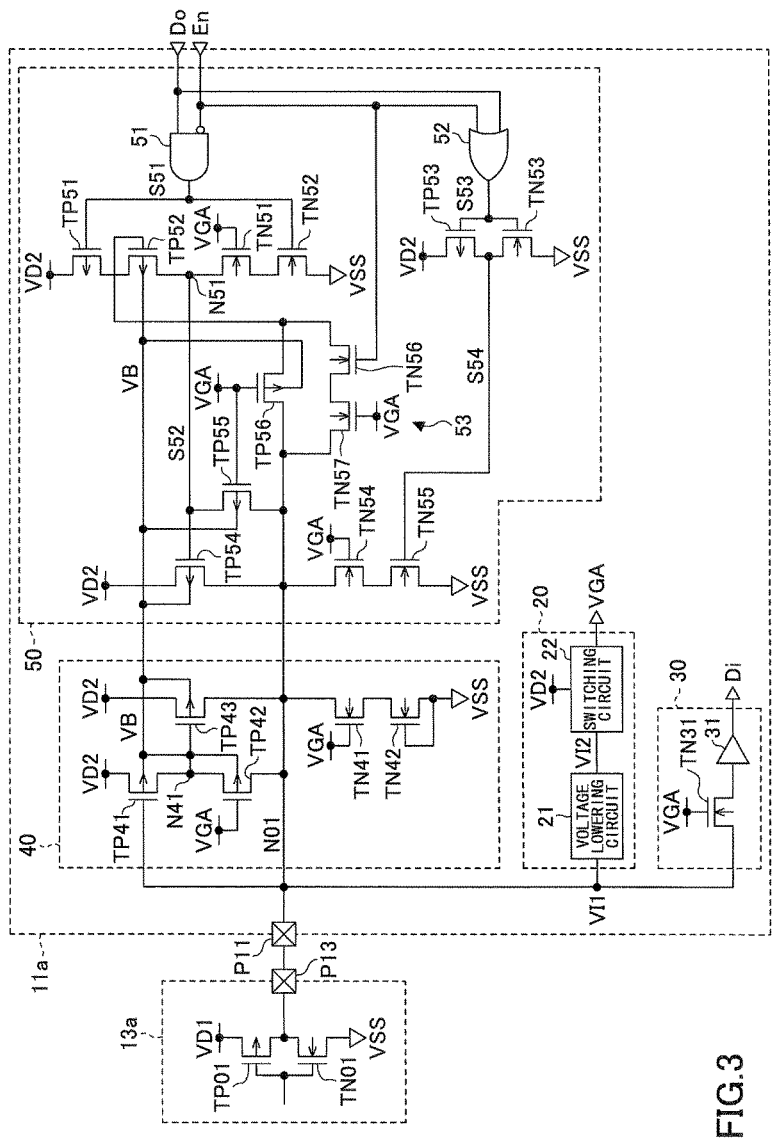
FIG. 3 is a circuit diagram of an input/output circuit.

As illustrated in FIG. 3, the interface circuit 11a is an input/output circuit, and includes an output circuit 50, an input circuit 30, a protection circuit 40, and a voltage control circuit 20.

The voltage control circuit 20 includes a step-down circuit 21 and a switching circuit 22.

The step-down circuit 21 is connected to the external terminal P11. An input voltage "VI1" is externally applied to a node N01 which is connected to the external terminal P11. Based on the input voltage "VI1" which is applied to via the external terminal P11, that is, based on the input voltage "VI1" which is applied to the node N01, the step-down circuit 21 generates an internal voltage "VI2" which is lower than the input voltage "VI1". Here, the parts where the input voltage "VI1" is applied to are the external terminal P11 and the node N01. Therefore, the connections, etc., are described by referring to the external terminal P11 or the node N01.

To the switching circuit 22, the internal voltage "VI2" and the high potential voltage "VD2" are supplied. The switching circuit 22 outputs a control voltage "VGA" based on the internal voltage "VI2" or the high potential voltage "VD2". The switching circuit 22 switches between the internal voltage "VI2" and the high potential voltage "VD2" based on the voltages of the internal voltage "VI2" and the high potential voltage "VD2", and generates the control voltage "VGA" based on the switched voltage. For example, when the internal voltage "VI2" is lower than the high potential voltage "VD2", the switching circuit 22 generates the control voltage "VGA" which has a level corresponding to the high potential voltage "VD2". On the other hand, when the high potential voltage "VD2" is lower than the internal voltage "VI2", the switching circuit 22 generates the control voltage "VGA" which has a level corresponding to the internal voltage "VI2".

Further, the high potential voltage "VD2" is supplied or stopped in accordance with the operations of the semiconductor apparatus 11 illustrated in FIG. 1. The step-down circuit 21 is set so as to generate the internal voltage "VI2" which is lower than the high potential voltage "VD2". Therefore, when the high potential voltage "VD2" is supplied to the switching circuit 22, the switching circuit 22 generates the control voltage "VGA" based on the high potential voltage "VD2". Further, when the high potential voltage "VD2" is not supplied to the switching circuit 22, the switching circuit 22 generates the control voltage "VGA" based on the internal voltage "VI2".

Figure 2:
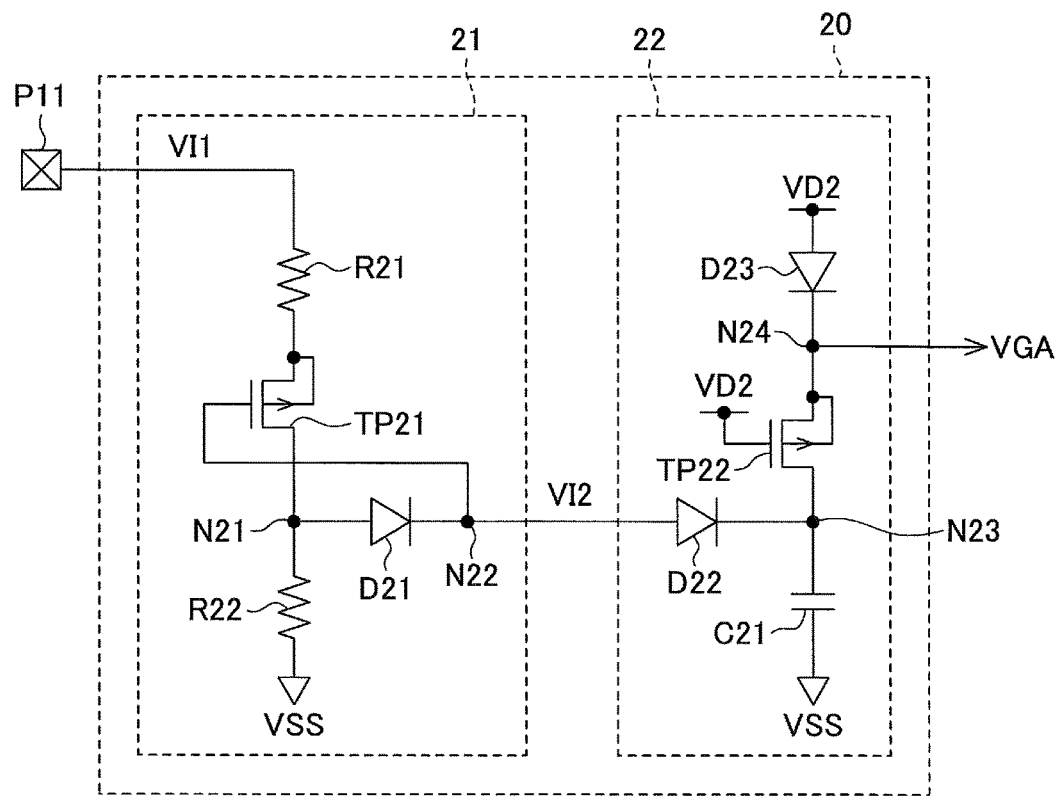
FIG. 2 is a circuit diagram of a voltage control circuit.

As illustrated in FIG. 2, the step-down circuit 21 of the voltage control circuit 20 includes a transistor TP21, resistors R21 and R22, and a diode D21. For example, the transistor TP21 is a P-channel MOS transistor. A first terminal of the resistor R21 (first resistor) is connected to the external terminal P11, and a second terminal of the resistor R21 is connected to the source terminal of the transistor TP 21. The drain terminal of the transistor TP 21 is connected to a first terminal of the resistor R22 (second resistor), and a second terminal of the resistor R22 is connected to a line to which a high potential voltage "VSS" is applied (hereinafter may be referred to as a "power line "VSS""). A node N21 between the drain terminal of the transistor TP 21 and the resistor R22 is connected to the anode of the diode D21, and the cathode of the diode D21 is connected to the gate terminal of the transistor TP 21. Further, the cathode of the diode D21 is connected to the switching circuit 22.

The step-down circuit 21 includes a series circuit in which the resistor R21, the transistor TP 21, and the resistor R22 are connected in series. The series circuit is connected between the external terminal P11 and the power line "VSS". Therefore, the series circuit of the resistor R21, the transistor TP 21, and the resistor R22 generates a voltage, which is divided from the input voltage "VI1", at the node N21 between the transistor TP 21 and the resistor R22.

Further, the step-down circuit 21 outputs the internal voltage "VI2" from the cathode of the diode D21 based on the voltage at the node N21. The internal voltage "VI2" is returned to the gate terminal of the transistor TP21 of the step-down circuit 21.

The switching circuit 22 includes a transistor TP 22, a capacitor C21, and diodes D22 and D23. For example, the transistor TP22 is a P-channel MOS transistor. To the anode of the diode D22, the internal voltage "VI2", which is generated by the step-down circuit 21, is applied. The cathode of the transistor D22 is connected to a first terminal of the capacitor C21, and a second terminal of the capacitor C21 is connected to the power line "VSS". A node N23 between the cathode of the diode D22 and the capacitor C21 is connected to the drain terminal of the transistor TP22. The source terminal of the transistor TP22 is connected to the cathode of the diode D23, and the anode of the diode D23 is connected to a line to which the high potential voltage "VD2" is supplied to (hereinafter may be referred to as a "power line "VD2""). The gate terminal of the transistor TP 22 is connected to the "power line "VD2"". The switching circuit 22 generates the control voltage "VGA" which has a level at a node N24 between the source terminal of the transistor TP22 and the diode D23.

The operations (functions) of the voltage control circuit 20 are described.

In the voltage control circuit 20 of FIG. 2, when the input voltage "VI1" at the external terminal P11 is a low potential voltage "VSS" level, the voltage at the nodes N21 and N22 is a low potential voltage level (L level).

An input signal having a high potential voltage "VD1" level (input voltage "VI1") is applied to the external terminal P11. In this case, the gate voltage of the transistor TP21 is the L level (low potential voltage "VSS" level). Therefore, the transistor TP21 turns on. Accordingly, a current flows from the external terminal P11 to the power line "VSS" via the resistor R21, the transistor TP21, and the resistor R22. Due to the current, the voltage potential at the node N21 is increased from the low potential voltage "VSS" level.

Further, a part of the current flowing from the external terminal P11 is supplied to the capacitor C21 via the diodes D21 and D22 to charge the capacitor C21. The potential of the node N23 is increased in accordance with the charged amount (stored change amount) of the capacitor C21.

Based on the potential change at the node N21, the potential of the node N22 connected to the anode of the diode D21, that is, the gate voltage of the transistor TP21, is increased from the low potential voltage "VSS". The on-resistance value of the transistor TP21 is increased as the gate voltage increases. Based on the increase of the on-resistance value of the transistor TP 21, an amount of the current, which flows from the external terminal P11 to the power line "VSS", is decreased. That is, the amount of current flowing from the external terminal P11 is decreased.

As described above, the step-down circuit 21 generates the internal voltage "VI2" by dividing the input voltage "VI1" based on the resistance values of the resistor R21, the transistor TP21, and the resistor R22 which are connected in series. Then, the potential of the node N23 of the switching circuit 22 is set to the potential in accordance with the internal voltage "VI2" (i.e., the potential which is lower than the internal voltage "VI2" by the forward voltage of the diode D22).

Based on the potential of the node N23 and the high potential voltage "VD2", the switching circuit 22 switches the voltage to generate the control voltage "VGA". The internal voltage "VI2" is set in a manner such that the potential of the node N23 is lower than the sum of the high potential voltage "VD2" and the threshold voltage "Vthp" of the transistor TP 22 (="VD2"+"Vthp") in the switching circuit 22 to which the high potential voltage "VD2" is applied. The internal voltage "VI2" is generated based on the resistance values of the resistors R21 and R22 and the on-resistance value of the transistor TP21. Therefore, the resistance values of the resistors R21 and R22 and the on-resistance value of the transistor TP21 are set in a manner such that the charge voltage of the capacitor C21 (the voltage of the node N23) is lower than the sum of the high potential voltage "VD2" and the threshold voltage "Vthp" of the transistor TP 22 (="VD2"+"Vthp") in the switching circuit 22 when the high potential voltage "VD2" is supplied to the switching circuit 22.

By setting as described above, the transistor TP 22 does not turn on when the high potential voltage "VD2" is applied to the switching circuit 22. Therefore, it becomes possible for the switching circuit 22 to generate the control voltage "VGA" of a constant voltage based on the high potential voltage "VD2".

When (the supply of) the high potential voltage "VD2" is stopped, the gate voltage of the transistor TP22 is the low potential voltage "VSS" level. Therefore, in the switching circuit 22, the transistor turns on and the control voltage "VGA" is generated in accordance with the voltage at the node N23, that is, the internal voltage "VI2" (high potential voltage "VD1" level). Then, when the input voltage "VI1" is the L level (low potential voltage "VSS" level), the diode D22 cuts off the current path from the capacitor C21 to the external terminal P11. Therefore, the switching circuit 22 generates the control voltage "VGA" based on the charges stored in the capacitor C21.

As illustrated in FIG. 3, the input circuit 30 includes an input buffer circuit 31 and a transistor TN31. The input circuit 30 is an example of the internal circuit. In the following descriptions, a p-channel MOS transistor and an re-channel MOS transistor may be simplified as a transistor. For example, the transistor TN31 is an n-channel MOS transistor. A first terminal (e.g., the source terminal) of the transistor TN31 is connected to the external terminal P11, and a second terminal (e.g., the drain terminal) of the transistor TN 31 is connected to the input terminal of the input buffer circuit 31. To the gate terminal of the transistor TN31, the control voltage "VGA" is applied. The transistor TN31 is a protection element for the input buffer circuit 31. The external terminal P11 is connected to the input terminal of the input buffer circuit 31 via the transistor TN31. The input buffer circuit 31 outputs an input signal "Di" based on an external signal which is supplied to the external terminal P11.

The protection circuit 40 includes p-channel MOS transistors TP41 through TP43 and re-channel MOS transistors TN41 and TN42. The source terminal of the transistor TP41 is connected to the power line "VD2", and the gate terminal of the transistor TP41 is connected to the external terminal P11 (node N01). The drain terminal of the transistor TP41 is connected to the source terminal (second terminal) of the transistor TP42, and the drain terminal (first terminal) of the transistor TP42 is connected to the node N01. To the gate terminal (control terminal) of the transistor TP42, the control voltage "VGA" is applied.

The node N41 between the drain terminal of the transistor TP 41 and the source terminal of the transistor TP42 is connected to the gate terminal of the transistor TP43. The source terminal of the transistor TP43 is connected to the power line "VD2", and the drain terminal of the transistor TP43 is connected to the node N01. Further, the node N41 is connected to the back gate terminals (N-type well regions: N-well) of the transistors TP41, TP42 and TP43. Therefore, the voltage of the node N41 is applied to the back gate terminals of the transistors TP41, TP42 and TP43 as a back gate voltage "VB". The transistors Tp42 and TP43 are an example of the internal circuit.

The drain terminal of the transistor TN 41 is connected to the node N01. To the gate terminal of the transistor TN41, the control voltage "VGA" is applied. The source terminal of the transistor TN41 is connected to the drain terminal of the transistor TN42, and the source terminal and the gate terminal of the transistor TN 42 are connected to the power line "VSS".

The output circuit 50 includes an AND gate 51, an OR gate 52, a transfer gate 53, p-channel MOS transistors TP51 through TP56, and n-channel MOS transistors TN51 through TN57. The output circuit 50 is an example of the internal circuit.

To the AND gate 51, output data "Do" and an enable signal "En" are supplied. In response to the enable signal "En" having an L level, the AND gate 51 outputs a signal "S51" having a level equal to the output data "Do". In response to the enable signal "En" having an H level, the AND gate 51 outputs a signal "S51" having an L level.

The output terminal of the AND gate 51 is connected to the gate terminal of the transistor TP51 and the gate terminal of the transistor TN52. The source terminal of the transistor TP51 is connected to the power line "VD2", and the drain terminal of the transistor TP51 is connected to the source terminal of the transistor TP52. The drain terminal of the transistor TP52 is connected to the drain terminal of the transistor TN51. The source terminal of the transistor TN51 is connected to the drain terminal of the transistor TN52, and the source terminal of the transistor TN52 is connected to the power line "VSS". The gate terminal of the transistor TP52 is connected to the external terminal P11 via the transfer gate 53. To the gate terminal of the transistor TN51, the control voltage "VGA" is applied.

The transfer gate 53 includes the transistors TP56, TN56, and TN57. A first terminal of the transistor TP56 is connected to the gate terminal of the transistor TP52, and a second terminal of the transistor TP56 is connected to the node N01. To the gate terminal of the transistor TP56, the control voltage "VGA" is applied. The first terminal of the transistor TP56 is connected to a first terminal of the transistor TN56, a second terminal of the transistor TN56 is connected to a first terminal of the transistor TN 57, and a second terminal of the transistor TN57 is connected to the second terminal of the transistor TP56. Therefore, the two transistors TN56 and TN57, which are connected in series, and the one transistor TP56 are connected in parallel with each other. To the gate terminal of the transistor TN56, the enable signal "En" is supplied. To the gate terminal of the transistor TN57, the control voltage "VGA" is applied.

The node N51 between the drain terminal of the transistor TP52 and the drain terminal of the transistor TN51 is connected to the gate terminal of the transistor TP54. The source terminal of the transistor TP54 is connected to the power line "VD2", and the drain terminal of the transistor TP54 is connected to the node N01. The transistor TP54 is a pull-up transistor relative to the node N01. The transistor TP54 turns on and off based on a signal "S52" (the level of the node N51). The transistor, which is turned on, pulls up the node N01.

Further, the node N51 is connected to the source terminal of the transistor TP55, and the drain terminal of the transistor TP55 is connected to the node N01. To the gate terminal of the transistor TP55, the control voltage "VGA" is applied. To the back gate terminal of the transistor TP55, the back gate voltage "VB" is applied. The transistor TP55 turns on and off based on the voltage of the node N01 (input voltage "VI1"). When the input voltage "VI1" is higher than or equal to the control voltage "VGA" by the threshold value of the transistor TP55, the transistor TP55 turns on. Then, via the transistor TP55 which is turned on, an input voltage is applied to the gate terminal of the transistor TP54, so that the transistor TP54 turns off.

To the OR gate 52, the output data "Do" and the enable signal "En" are supplied. In response to the enable signal "En" having an L level, the OR gate 52 outputs a signal "S53" having the level equal to the output data "Do". In response to the enable signal "En" having an H level, the OR gate 52 outputs a signal "S53" having an H level.

The output terminal of the OR gate 52 is connected to the gate terminal of the transistor TP53 and the gate terminal of the transistor TN53. The source terminal of the transistor TP53 is connected to the power line "VD2". The drain terminal of the transistor TP53 is connected to the drain terminal of the transistor TN53. The source terminal of the transistor TN53 is connected to the power line "VSS". The node N52 between the drain terminal of the transistor TP53 and the drain terminal of the transistor TN53 is connected to the gate terminal of the transistor TN55. The transistors TP53 and TN53 generate a signal "S54" having a level generated by logically inverting the level of the signal "S53".

The source terminal of the transistor TN55 is connected to the power line "VSS", the drain terminal of the transistor TN55 is connected to the source terminal of the transistor TN54, and the drain terminal of the transistor TN54 is connected to the node N01. To the gate terminal of the transistor TN54, the control voltage "VGA" is applied. The transistors TN54 and TN55 are a pull-down transistor relative to the node N01. In response to the signal "S54", the transistor TN55 turns on and off. The transistor TN55, which is turned on, pulls down the node N01 which is connected via the transistor TN54.

In the output circuit 50, the signal "S51", which has a level based on the output data "Do", is output from the AND gate 51 based on the enable signal "En" having an L level, and turns on and off the transistors TP51 and TN52. By doing this, the signal "S52", which has the level in accordance with the output data "Do", is generated, so as to turn on and off the transistor TP54. Further, based on the enable signal having an L level, the signal "S53", which has level based on the output data "Do", is output from the OR gate 52. The transistors TP53 and TN53 generates the signal "S54" by logically inverting the signal "S53". By doing this, based on the output data "Do", the transistor TN55 complementarily turns on and off relative to the transistor TP54. Accordingly, the output circuit 50 outputs an output signal having the same logical level as that of the output data "Do".

Further, based on the enable signal having an H level, the output circuit 50 outputs the signal "S51" having an L level from the AND gate 51, which turns on the transistor TP51 and turns off the transistor TN52. Due to this, the signal "S52" having an H level is generated, so that the transistor TP54 turns off. Further, based on the enable signal having an H level, the OR gate 52 outputs the signal "S53" having an H level, so that the transistor TP53 turns off and the transistor TN 53 turns on. Due to this, the signal having an L level is generated and the transistor TN55 turns off. Accordingly, the output circuit 50 sets the external terminal P11 to a high impedance state.

As illustrated in FIG. 1, the external terminal P11 of the semiconductor apparatus 11 is connected to the external terminal P13 of the semiconductor apparatus 13. The semiconductor apparatus 13 includes the interface circuit 13a which is connected to the external terminal P13.

As illustrated in FIG. 3, the interface circuit 13a includes a p-channel MOS transistor TP01 and an n-channel MOS transistor TN01. The source terminal of the transistor TP01 is connected to a line of the high potential voltage "VD1" (hereinafter may be referred to as a "power line "VD1""). The drain terminal of the transistor TP01 is connected to the drain terminal of the transistor TN01, and the source terminal of the transistor TN01 is connected to a line of the low potential voltage "VSS" (power line "VSS"). For example, the low potential voltage "VSS" is a ground potential (ground level=0 V). A node between the transistor TP01 and the transistor TN01 is connected to the external terminal P13. Therefore, the interface circuit 13a outputs a signal having the high potential voltage "VD1" level or the low potential voltage "VSS" level. As a result, the input voltage "VI1" at the node N01 in the interface circuit 11a is either the high potential voltage "VD1" level or the low potential voltage "VSS" level.

Figure 4:
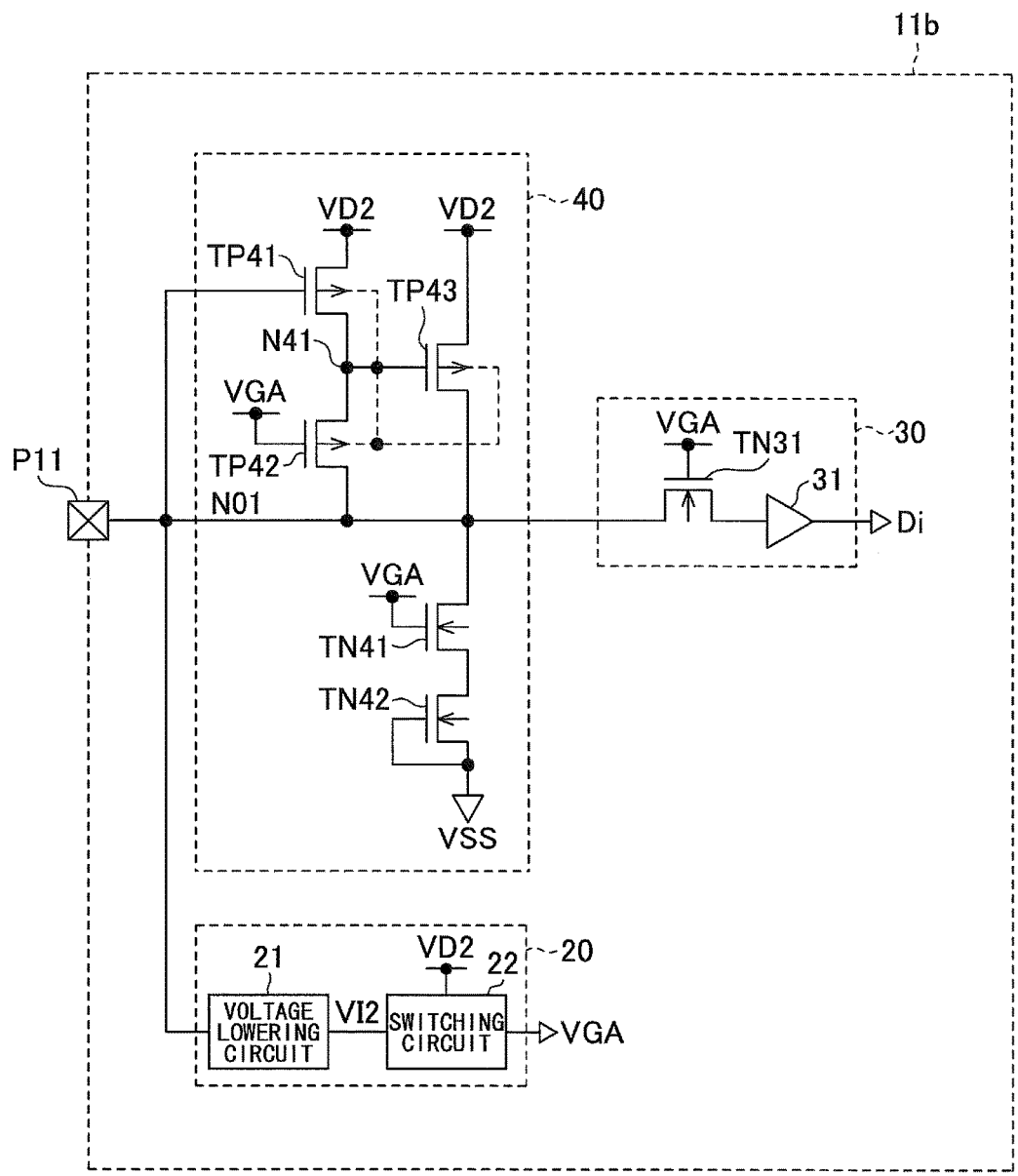
FIG. 4 is a circuit diagram of an input circuit.

FIG. 4 illustrates in interface circuit 11b where the above voltage control circuit 20 is applied. The interface circuit 11b includes the voltage control circuit 20, the input circuit 30, and the protection circuit 40, and does not include the output circuit 50. Note that the voltage control circuit 20 may be an interface circuit for output, that is, an interface circuit which does not include the input circuit 30 of FIG. 3.

Next, comparative examples relative to the interface circuit 11a are described. Note that the same reference numerals are used to describe the same elements as those in the interface circuit 11a.

Figure 7:
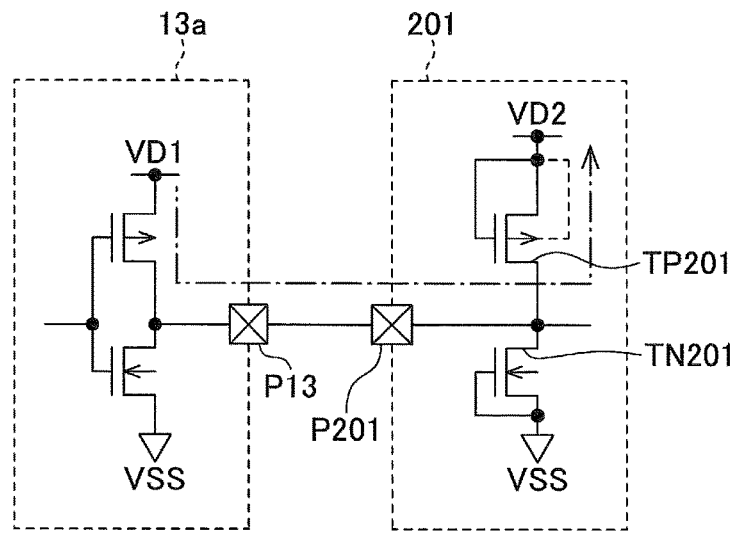
FIG. 7 is a circuit diagram of an input circuit according to a comparative example.

A protection circuit 201 of FIG. 7 includes a transistor TP201 and a transistor TN201 which are connected to the external terminal P201. The source terminal and the drain terminal of the transistor TP201 are connected to the power line "VD2" and the external terminal P201, respectively. The gate terminal and the back gate terminal of the transistor TP201 are connected to the power line "VD2". The source terminal of the transistor TN201 is connected to the power line "VSS", and the drain terminal of the transistor N201 is connected to the external terminal P201. The gate terminal and the back gate terminal of the transistor TN201 are connected to the power line "VSS".

The transistor TP201 and the transistor TN201 of the protection circuit 201 function as two diodes connected in series between the power line "VD2" and the power line "VSS". The protection circuit 201 clamps the voltage relative to the internal circuit (not shown) connected to the external terminal P201 to a predetermined voltage in accordance with the transistor TP201 and the transistor TN201.

The transistor TP201 of the protection circuit 201 includes a P-N junction diode by the connection between the back gate terminal and the source terminal. For example, the external terminal P201 is connected to the external terminal P13 of the interface circuit 13a which is operated by the high potential voltage "VD1". In this case, the high potential voltage "VD1" of the interface circuit 13a is higher than the high potential voltage "VD2" of the protection circuit 201. Due to this, as illustrated by the dashed-dotted line, a current flows from the power line "VD1" of the semiconductor apparatus including the interface circuit 13a to the power line "VD2" of the semiconductor apparatus including the protection circuit 201 via the P-N junction diode.

Figure 8:
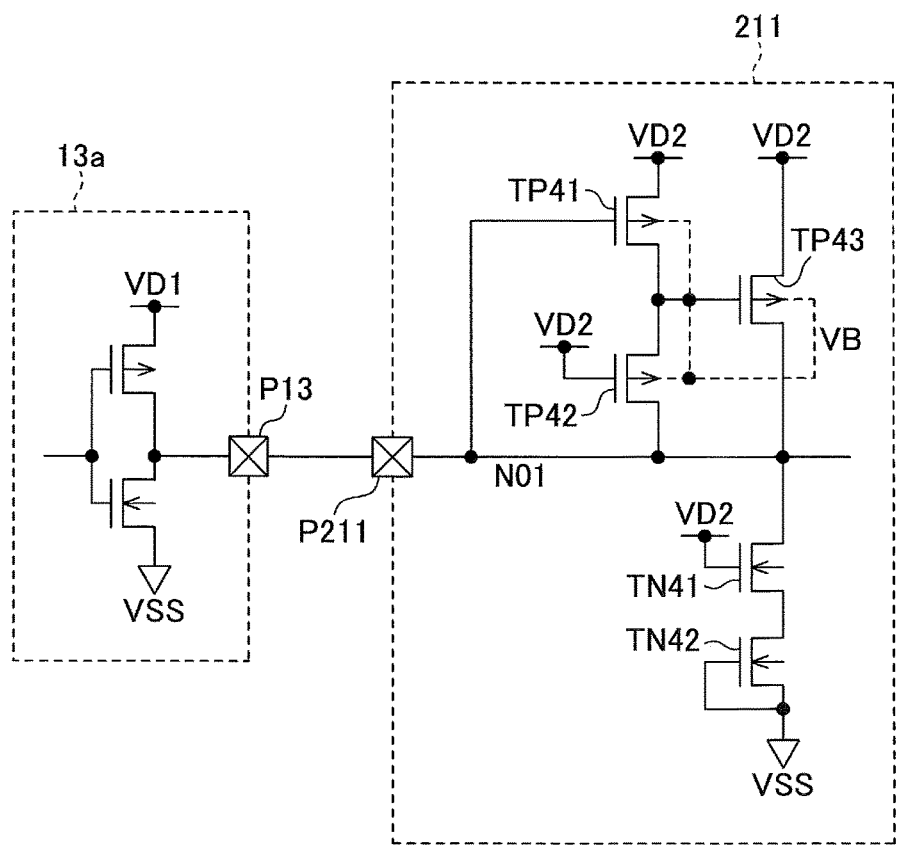
FIG. 8 is a circuit diagram of a voltage control circuit according to a comparative example.

Similar to the protection circuit 40 of FIG. 3, a protection circuit 211 of FIG. 8 includes transistors TP41 through TP43, and transistors TN41 and TN42. In the protection circuit 211, the gate terminal of the transistor TP42 is connected to the power line "VD2". The transistors TP41 and TP42 supply the high potential voltage "VD2" or the voltage at the node N01, whichever is higher, to the gate terminal and the back gate terminal of the transistor TP43 as the back gate voltage "VB". The transistor TP43 of the protection circuit 211 does not form a P-N junction diode. When the input voltage "VI1" is applied from the interface circuit 13a connected to the external terminal P211, a current path from the power line "VD1" to the power line "VD2" is not generated. That is, no current flow occurs from the semiconductor apparatus including the interface circuit 13a to the semiconductor apparatus including the protection circuit 211.

In FIG. 8, when the withstand voltage of the transistor TN42 is changed (to a high voltage transistor), it is possible to remove the transistor TN41. In this case, however, the transistor TN42 having the adjusted withstand voltage is formed in a step other than a step in which the internal circuit (e.g., an n-channel MOS transistor in the input buffer circuit) is formed. Due to this, the number of the manufacturing process as of the semiconductor apparatus may be increased. Also, the design of the semiconductor apparatus may be more complicated.

Figure 9:
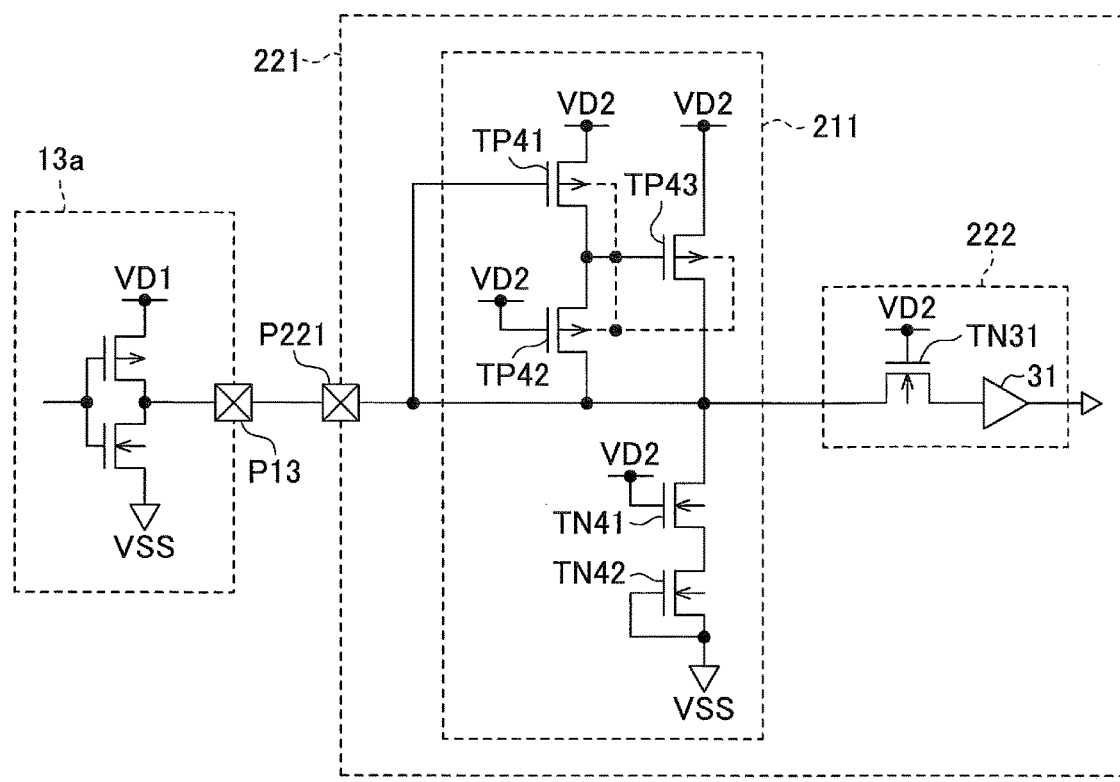
FIG. 9 is a circuit diagram of a protection circuit according to a comparative example.

An interface circuit 221 of FIG. 9 includes the protection circuit 211 of FIG. 8 and an input circuit 222. Similar to the input circuit 30 of FIG. 3, the input circuit 222 includes the transistor TN31 and the input buffer circuit 31. To the gate terminal of the transistor TN31, the high potential voltage "VD2" is applied.

Here, it is assumed that the operating voltage of the semiconductor apparatus including the interface circuit 221 (high potential voltage "VD2") is 1.5 V. Further, for example, it is assumed that the operating voltage of the interface circuit 13a connected to the external terminal P211 of the interface circuit 221 is 5 V. In this case, the withstand voltage of the transistors included in the interface circuit 221 is set in accordance with the input voltage "VI1" of the high potential voltage "VD1" (=5 V). For example, transistors having the withstand voltage of 3.3 V are used. For example, the withstand voltage between gate and source "Vgs" is 4.6 V. In this interface circuit 221, the input voltage "VI1" is limited to a voltage in a manner such that the difference between the input voltage "VI1" and the high potential voltage "VD2" (VI1−VD2) is lower than the withstand voltage between gate and source "Vgs" (VI1−VD2<Vgs). Accordingly, the input voltage "VI1" is limited to the following range: VI1<VD2+Vgs.

For example, when the high potential voltage "VD2" is supplied, VD2+Vgs=6.1 V is acquired. Therefore, it is possible to apply 5 V as the input voltage "VI1". On the other hand, however, when the high potential voltage "VD2" is stopped, VD2+Vgs=4.6 V. Therefore, it is not possible to apply 5 V as the input voltage "VI1". That is, there occurs a limitation in the input voltage "VI1".

In response to the limitation, it is thought that the input voltage "VI1" is lowered (decreased) and supplied to the interface circuit 221.

Figure 10:
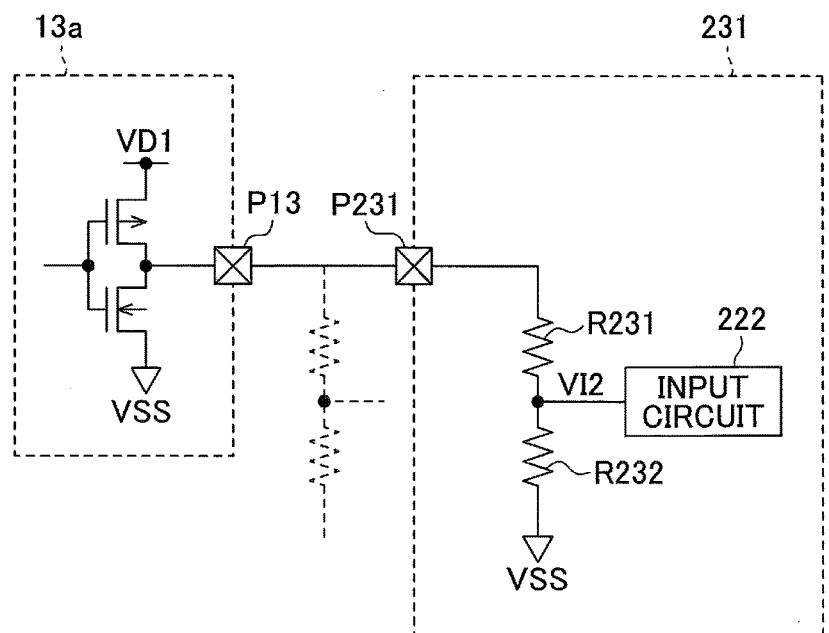
FIG. 10 is a circuit diagram of a protection circuit according to another comparative example.

For example, in an interface circuit 231 of FIG. 10, the internal voltage "VI2" is generated by dividing the input voltage "VI1" by the resistors R231 and R232 connected in series, so that the internal voltage "VI2" is applied to the input circuit 222. By doing this, the limitation of the input voltage "VI1" can be resolved.

However, the internal voltage "VI2" is generated by the resistors R231 and R232. Therefore, while an H level signal is output from the interface circuit 13a, a current flows from the power line "VD1" of the interface circuit 13a toward the power line "VSS". Such a current may impede the reduction of energy consumption.

Figure 11:
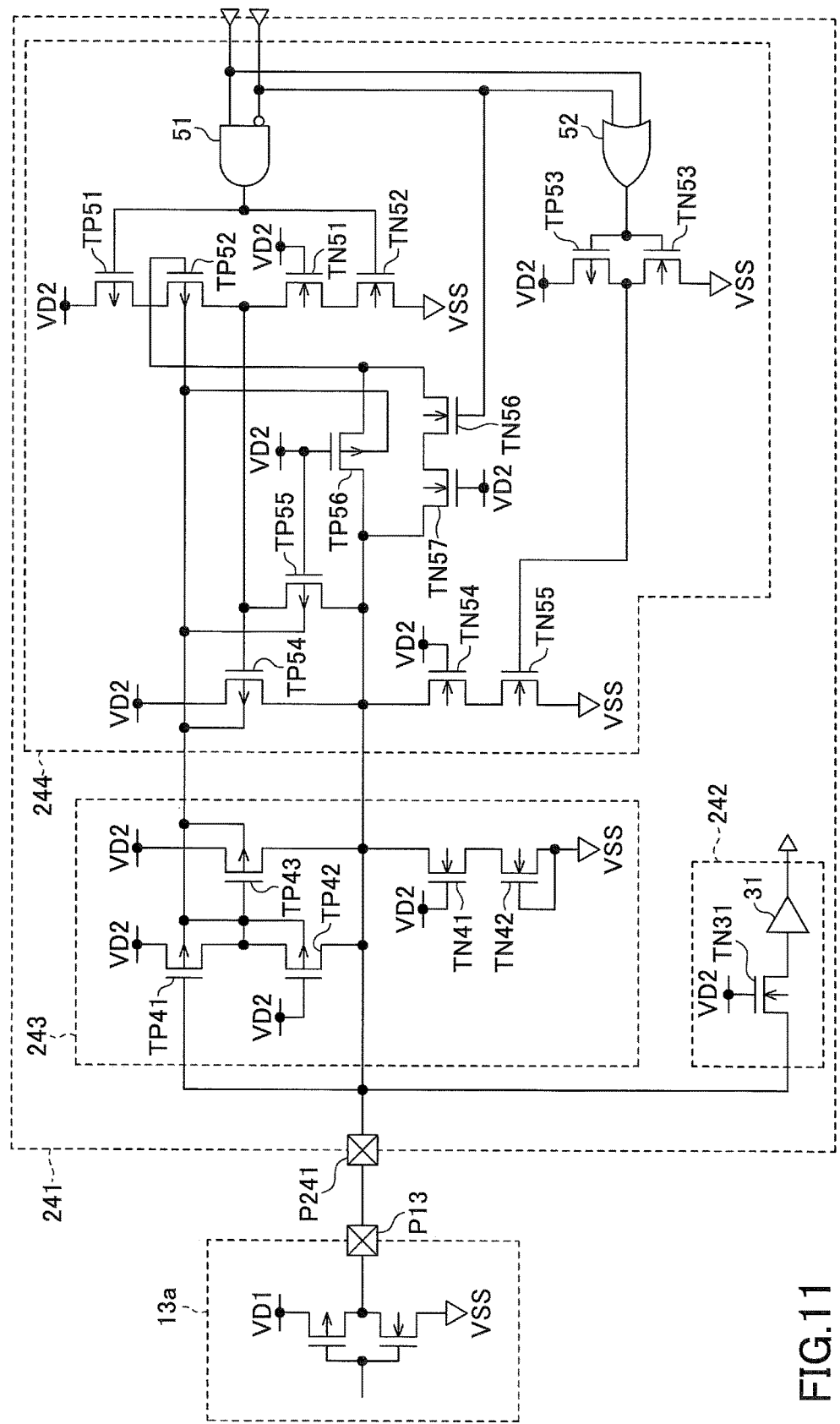
FIG. 11 is a circuit diagram of an input circuit according to another comparative example.

An interface circuit 241 of FIG. 11 includes an input circuit 242, a protection circuit 243, and an output circuit 244.

Similar to the input circuit 30 of FIG. 3, the input circuit 242 includes the transistor TN31 and the input buffer circuit 31. Further, to the gate terminal of the transistor TN31, the high potential voltage "VD2" is applied. Similar to the protection circuit 40 of FIG. 3, the protection circuit 243 includes the transistors TP41 through TP43, TN41, and TN42. To the gate terminals of the transistors TP42 and TN41 which are connected to an external terminal P241, the high potential voltage "VD2" is applied. Similar to the output circuit 50 of FIG. 3, the output circuit 244 includes the AND gate 51, the OR gate 52, the transistors TP51 through TP56 and TN51 through TN57. To the gate terminals of the transistors TP55, TP56, TN54, and TN57 which are connected to the external terminal P241, the high potential voltage "VD2" is applied.

The interface circuit 241 is connected to the interface circuit 13a which operates by, for example, the high potential voltage "VD1", so that the interface circuit 241 inputs an H level signal (high potential voltage "VD1") or an L level signal (input voltage "VI1") from the interface circuit 13a. When the supply of the high potential voltage "VD2" is stopped which is the drive voltage of the interface circuit 241, the following operations may be performed.

Figure 12A:
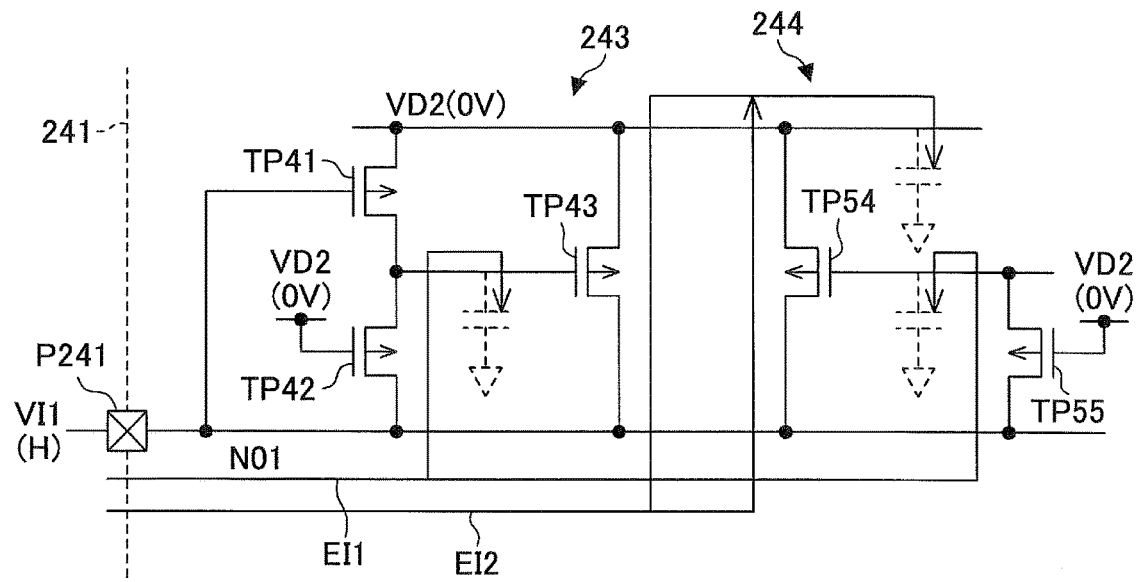
FIGS. 12A and 12B illustrate operations of the circuit of FIG. 11.

First, as illustrated in FIG. 12A, the input voltage "VI1" having an H level is applied to the external terminal P241. Then, based on the input voltage "VI1", the transistor TP42 turns on. Due to the current "EI1" flowing through the transistor TP42 which is turned on, a parasitic capacitance of the line between the transistor TP42 and the transistor TP43 is charged, so that the gate voltage of the transistor TP43 is increased from the low potential voltage "VSS" level. Due to the gate voltage, the transistor TP43 turns off. Similarly, due to the input voltage "VI1", the transistor TP55 turns on. Due to the current "EI1" flowing through the transistor TP55, the gate voltage of the TP54 is increased, and the transistor TP54 turns off. In a short time until the transistors are turned off, a current "EI2" (hazard current) flows toward the power line "VD2" through the transistors TP43 and TP54.

Figure 12B:
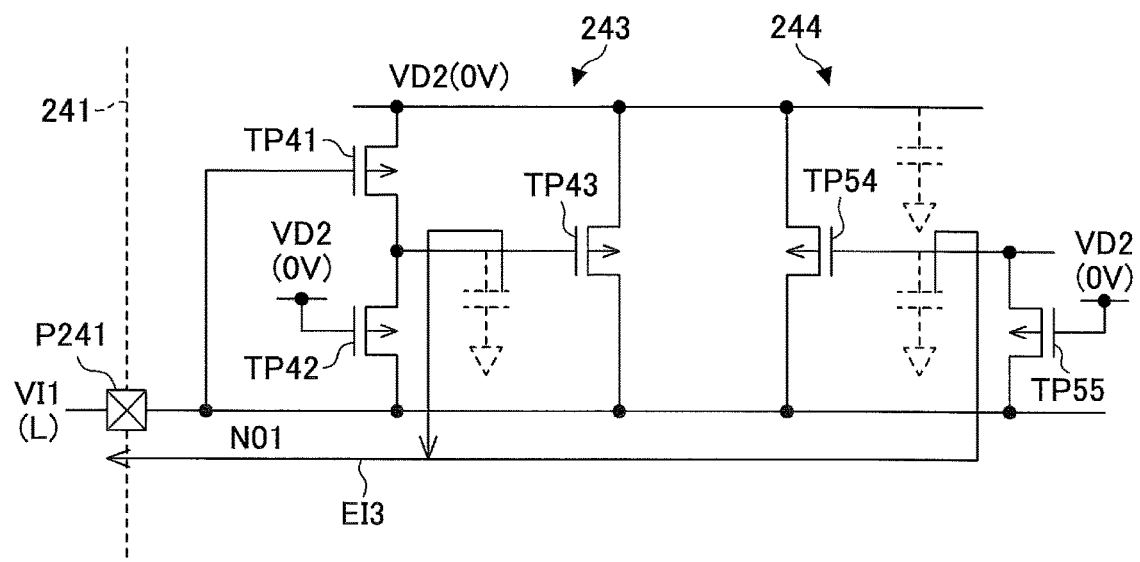

Next, as illustrated in FIG. 12B, the input voltage "VI1" having an L level is applied to the external terminal P241. In this case, the voltage at the source terminal of the transistor TP42 (the gate voltage of the transistor TP43) is an H level, and the gate voltage of the transistor TP42 is an L level (low potential voltage "VSS" level). Therefore, due to an L level of the input voltage "VI1", the transistor TP42 turns on, so that a current "EI3" flows toward the external terminal P241 through the transistor TP42 which is turned on. That is, the charges of the parasitic capacitance are discharged, so that the gate voltage of the transistor TP43 is an L level. Similarly, due to an L level of the input voltage "VI1", the transistor TP55 turns on. The charges of the parasitic capacitance are discharged through the transistor TP55 which is turned on, so that the gate voltage of the transistor TP54 is an L level.

As described above, the above operations are repeated based on the input voltages "VI1" and the hazard current flows to the power line "VD2". Due to the hazard current, the level of the power line "VD2" is rendered unstable. Due to this, a failure may occur in the operations of not only the semiconductor apparatus including the interface circuit 241 but also the semiconductor apparatus mounted on the substrate.

Next, functions of the interface circuit 11a in this embodiment are described.

In the voltage control circuit 20 of FIG. 2, based on an H level (high potential voltage "VD1" level) of the input voltage "VI1", the transistor TP21 of the step-down circuit 21 turns on. Then, due to a current flowing through the transistor TP21, which is turned on, and the resistors R21 and R22, the voltage at the node N21 is increased. Based on the change of the potential at the node N21, the potential of the node N22 connected to the anode of the diode D21 (i.e., the gate voltage of the transistor TP21) is increased from the low potential voltage "VSS". The on-resistance value of the transistor TP21 is increased as the gate voltage increases. In accordance with the increase of the on-resistance value of the transistor TP21, an amount of the current flowing from the external terminal P11 to the power line "VSS" is decreased. That is, an amount of the current flowing from the external terminal P11 is decreased.

The external terminal P11 is connected to the interface circuit 13a of FIG. 3, that is the external terminal P13 of the semiconductor apparatus 13. Therefore, an amount of the current from the semiconductor apparatus 13 is reduced. Due to this, energy consumption can be reduced when compared with a case where the internal voltage VI2 is generated by lowing the input voltage VI1 by using only a resistor.

A case where the high potential voltage "VD2" is supplied

In the interface circuit 11a of FIG. 3, based on the high potential voltage "VD2", the voltage control circuit 20 generates the control voltage "VGA" which is substantially equal to the high potential voltage "VD2".

In the protection circuit 40, the control voltage "VGA" is applied to the gate terminals of the transistors TP42 and TN41. The transistors TP41 and TP42 supply the high potential voltage "VD2" or the voltage at the node N01, whichever is higher, to the gate terminal and the back gate terminal of the transistor TP43 as the back gate voltage "VB". The transistor TP43 of the protection circuit 40 does not form a P-N junction diode. Therefore, when the input voltage "VI1" is applied from the interface circuit 13a connected to the external terminal P11, a current path, which is from the power line "VD1" to the power line "VD2", is not generated.

In the output circuit 50, the control voltage "VGA" is applied to the gate terminals of the transistors TP55, TP56, TN54, and TN57. The transistors TP55 and TP56 are turned on when the input voltage "VI1" is applied to the node N01. Through the transistors TP55 and TP56 which are turned on, the input voltage "VI1" is supplied to the gate terminals of the transistors TP54 and TP52. To the back gate terminals of the transistors TP54 and TP52, the back gate voltage "VB" is applied. Therefore, similar to the transistor TP43 in the protection circuit 40, a P-N junction diode is not formed in the transistors TP54 and TP52. Further, when the enable signal "En" is an H level, the transistor TP51, which is connected to the transistor TP52, turns on based on the signal S51 having an L level output from the AND gate 51. Due to this, when the input voltage "VI1" is supplied from the interface circuit 13a connected to the external terminal P11, the current path from the power line "VD1" to the power line "VD2" is not generated.

A case where supply of the high potential voltage "VD2" is stopped

In the interface circuit 11a of FIG. 3, the voltage control circuit 20 generates the internal voltage "VI2" by lowering the input voltage "VI1" having an H level (high potential voltage "VD1" level), and generates the control voltage "VGA" which is substantially equal to the internal voltage "VI2".

In the protection circuit 40, to the gate terminals of the transistors TP42 and TN41, the control voltage "VGA" is applied. For example, the control voltage "VGA" is set so as to be equal to the internal voltage "VI2" in the switching circuit 22 of FIG. 2. Therefore, it becomes possible to secure the withstand voltage of the transistors when compared with a circuit where the high potential voltage "VD2" is applied to the gate terminals. Further, it becomes possible to relax the limitation of the range (upper limit) of the input voltage "VI1" when compared with a case where the high potential voltage "VD2" is applied to the gate terminals.

The voltage control circuit 20 of FIG. 2 generates the control voltage "VGA" by the charges stored in the capacitor C21. Therefore, even when the input voltage "VI1" is lowered to an L level, the voltage control circuit 20 maintains the level of the control voltage "VGA". Due to the control voltage "VGA", the transistor TP42 it turned off in the protection circuit 40 of FIG. 3, so that the gate voltage of the transistor TP43 is not lowered to an L level. Therefore, the timing becomes earlier when the transistor TP43 turns off when the input voltage "VI1" having an H level is applied when compared with the case where the gate voltage of the TP43 becomes an L level as illustrated in FIG. 12B. Due to this, it becomes possible to reduce the current (hazard current) flowing to the power line "VD2" via the transistor TP43.

Similarly, in the output circuit 50 of FIG. 3, the control voltage "VGA" is applied to the gate terminal of the transistor TP55. Due to this, when the input voltage "VI1" is lowered to an L level, the transistor TP55 turns off, so that the gate voltage of the transistor TP54 is not lowered to an L level. Therefore, the timing becomes earlier when the transistor TP54 turns off when the input voltage "VI1" having an H level is applied when compared with the case where the gate voltage of the TP54 becomes an L level as illustrated in FIG. 12B. Due to this, it becomes possible to reduce the current (hazard current) flowing to the power line "VD2" via the transistor TP54.

As described above, according to this embodiment, the following effects are provided. (1-1) The voltage control circuit 20 includes the step-down circuit 21 and the switching circuit 22. The step-down circuit 21 is connected to the external terminal P11 (note N01). Based on the input from the external terminal P11, the step-down circuit 21 generates the internal voltage "VI2" which is lower than the voltage (terminal voltage). When the internal voltage "VI2" is lower than the high potential voltage "VD2", the switching circuit 22 outputs the control voltage "VGA" having a level corresponding to the high potential voltage "VD2". When the high potential voltage "VD2" is lower than the internal voltage "VI2", the switching circuit 22 outputs the control voltage "VGA" having a level corresponding to the internal voltage "VI2".

Therefore, when the high potential voltage "VD2" is applied, the control voltage "VGA" generated based on the high potential voltage "VD2" is applied to the gate terminals of the transistors (e.g., transistor TP42 in the protection circuit 40). By the control voltage "VGA", it becomes possible to secure the withstand voltage of the transistor TP42, etc. Further, when the supply of the high potential voltage "VD2" is stopped, the control voltage "VGA" generated based on the internal voltage "VI2" which is generated by lowering the input voltage "VI1" is applied to the gate terminals of the transistors (e.g., transistor TP42 of the protection circuit 40). By the control voltage "VGA", it becomes possible to secure the withstand voltage of the transistor TP42, etc.

(1-2) The switching circuit 22 includes the capacitor C21, and stores charges in the capacitor C21 in accordance with the internal voltage "VI2". Further, the when the input voltage "VI1" is an L level, the control voltage "VGA" is maintained by the charges stored in the capacitor C21. Such control voltage "VGA" prevents the gate voltage of the transistor TP43 from being lowered to an L level. Due to this, the off timing of the transistor TP43 becomes earlier when the input voltage "VI1" having an L level (high potential voltage "VD1" level) is applied when compared with a case where the gate voltage is lowered to an L level. Therefore, it becomes possible to reduce the hazard current flowing to the power line "VD2" via the transistor TP43.

(1-3) The step-down circuit 21 includes the series circuit of the resistor R21, the transistor TP21, and the resistor R22 between the external terminal P11 and the power line "VSS". To the gate terminal of the transistor TP21, the internal voltage "VI2" is applied. The on-resistance value of the transistor TP 21 increases as the increase of the internal voltage "VI2". That is, when the internal voltage "VI2" starts to increase from an L level, the on-resistance value of the transistor TP21 is small. Therefore, an amount of current flowing through the transistor TP21 is greater when compared with a case where the internal voltage "VI2" is generated by only the resistors. Therefore, the timing is earlier when compared with a case where the increase of the internal voltage "VI2" is based on only the resistors. Thus, it becomes possible to reduce the generation time of the control voltage "VGA".

(1-4) The on-resistance value of the transistor TP21 in the step-down circuit 21 increases as the increase of the internal voltage "VI2". In accordance with the increase of the on-resistance value of the transistor TP21, an amount of the current flowing from the external terminal P11 to the power line "VSS" is decreased. That is, the amount of the current from the external terminal P11 is smaller when compared with the case where the internal voltage "VI2" is generated by only the resistors. Due to this, it becomes possible to reduce energy consumption in the interface circuit 13a connected to the external terminal P11.

Second Embodiment

In the following, a second embodiment is described.

A voltage control circuit in this embodiment differs from that in the first embodiment. Therefore, the voltage control circuit in this embodiment is described.

Figure 5:
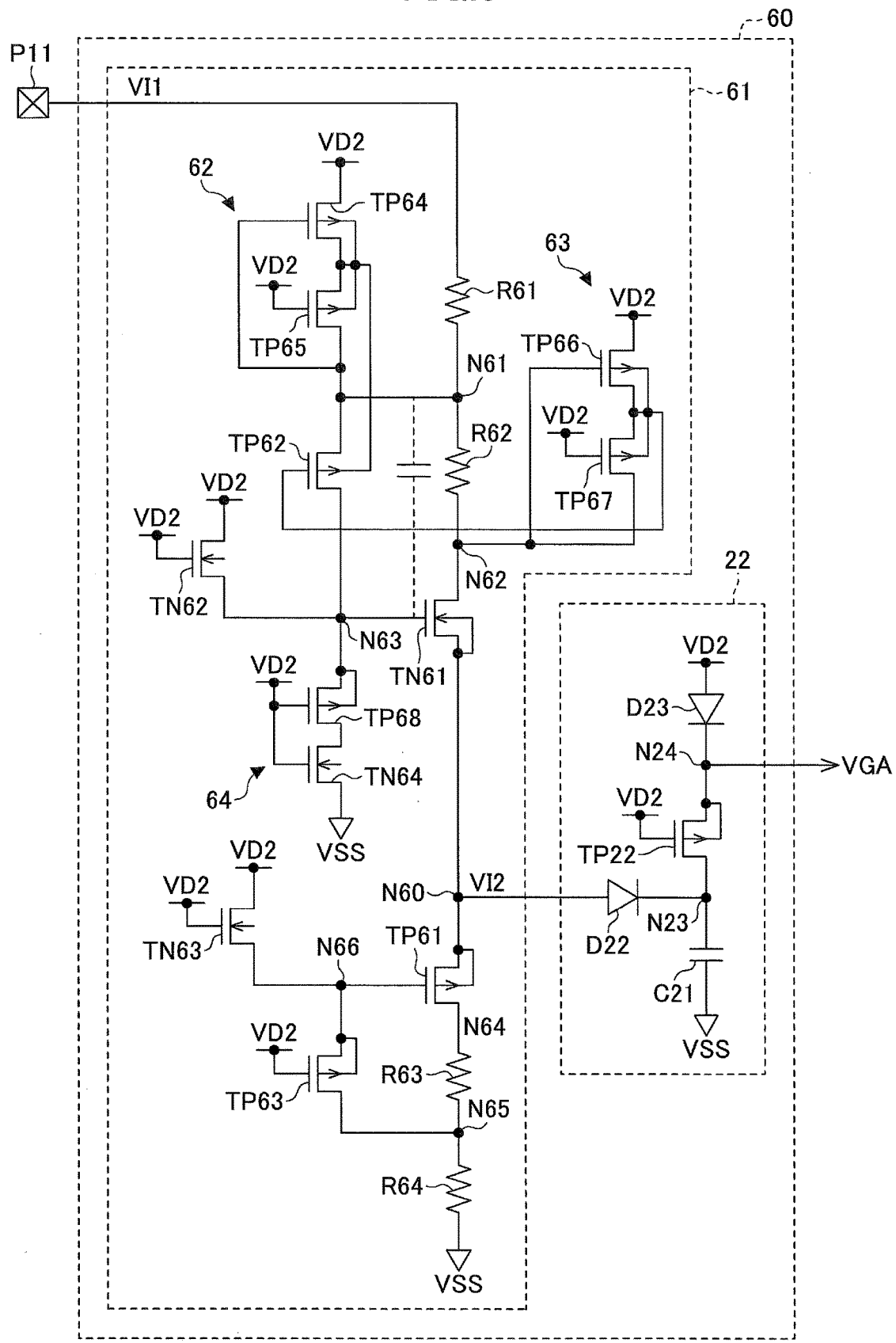
FIG. 5 is a circuit diagram illustrating a second embodiment.

As illustrated in FIG. 5, a voltage control circuit 60 includes a step-down circuit 61 and the switching circuit 22. The step-down circuit 61 includes p-channel MOS transistors TP61 through TP68, n-channel MOS transistors TN61 through TN64, and resistors R61 through R64.

A first terminal of the resistor R61 (first resistor) is connected to the external terminal P11, and a second terminal of the resistor R61 is connected to a first terminal of the resistor R62 (second terminal). A second terminal of the resistor R62 is connected to the drain terminal of the transistor TN61, and the source terminal of the transistor TN61 is connected to the source terminal of the transistor TP61. The back gate terminal (well region: P-well) of the transistor TN61 is connected to the source terminal of the same transistor TN61. The back gate terminal of the transistor TP61 is connected to the source terminal of the same transistor TP61. The drain terminal of the transistor TP61 is connected to a first terminal of the resistor R63 (third resistor), and a second terminal of the resistor R63 is connected to a first terminal of the resistor R64 (fourth resistor). A second terminal of the resistor R64 is connected to the power line "VSS". That is, in the step-down circuit 61, the resistors R61 and R62, the transistor TN61, the transistor TP61, and the resistors R63 and R64 are connected in series between the external terminal P11 and the power line "VSS".

The gate terminal of the transistor TN61 is connected to the source terminal of the transistor TN62. The drain terminal and the gate terminal of the transistor TN62 are connected to the power line "VD2".

Further, the gate terminal of the transistor TN61 is connected to the drain terminal of the transistor TP62, and the source terminal of the transistor TP62 is connected to a node N61 which is between the resistor R61 and the resistor R62. To the node N61, a first control circuit 62 is connected.

The first control circuit 62 includes transistors TP64 and TP65. The source terminal of the transistor TP64 is connected to the power line "VD2", and the drain terminal of the transistor TP64 is connected to the source terminal of the transistor TP65. The drain terminal of the transistor TP65 is connected to the node N61 and the source terminal of the transistor TP62. The gate terminal of the transistor TP64 is connected to the node N61 and the source terminal of the TP62. The gate terminal of the transistor TP65 is connected to the power line "VD2". The node between the drain terminal of the transistor TP64 and the source terminal of the transistor TP65 is connected to the back gate terminals (Well region: N-well) of the transistors TP62, TP64, and TP65. The first control circuit 62 supplies the high potential voltage "VD2" or the potential at the node N61, whichever is greater, to the back gate terminal of the transistor TP62 as the back gate voltage.

To the gate terminal of the transistor TP62, a control voltage from a second control circuit 63 is supplied. The second control circuit 63 is connected to a node N62 between the resistor R62 and the transistor TN61. The second control circuit 63 includes transistors TP66 and TP67. The source terminal of the transistor TP66 is connected to the power line "VD2", the drain terminal of the transistor TP66 is connected the source terminal of the transistor TP67, and the drain terminal of the transistor TP67 is connected to the node N62. Further, the node N62 is connected to the gate terminal of the transistor TP66. The node between the drain terminal of the transistor TP66 and the source terminal of the transistor TP67 is connected to the back gate terminals of the transistors TP66 and TP67 and the gate terminal of the transistor TP62. The second control circuit 63 supplies the high potential voltage "VD2" or the potential at the node N62, whichever is greater, to the gate terminal of the transistor TP62 as the back gate voltage.

Further, the gate terminal of the transistor TN61 is connected to the source terminal and the back gate terminal of the transistor TP68. The drain terminal of the transistor TP68 is connected to the drain terminal of the transistor TN64, and the source terminal of the transistor TN64 is connected to the power line "VSS". Further, the gate terminals of the transistor TP68 and the transistor TN64 are connected to the power line "VD2".

The gate terminal of the transistor TP61 is connected to the source terminal of the transistor TN63. The drain terminal and the gate terminal of the transistor TN63 are connected to the power line "VD2".

Further, the gate terminal of the transistor TP61 is connected to the source terminal of the transistor TP63. The gate terminal of the transistor TP63 is connected to the power line "VD2", and the back gate terminal thereof is connected to the source terminal thereof. The drain terminal of the transistor TP63 is connected to a node N65 which is between the resistor R63 and the resistor R64.

A node N60 between the source terminal of the transistor TN61 and the source terminal of the transistor TP61 is connected to the switching circuit 22. The step-down circuit 61 generates the internal voltage "VI2" to the node N60.

Next, the operations (functions) of the voltage control circuit 60 are described.

When supply of the high potential voltage "VD2" is stopped

When the input voltage "VI1" is applied to the external terminal P11, the potential of the node N63 is gradually increased from an L level (≈0 V) due to capacitance coupling by a parasitic capacitor between the node N63 and the node N61, so that the transistor TN61 turns on. The transistor TP63, to the gate terminal of which the high potential voltage "VD2" is applied, turns on. By the transistor TP63, the transistor TP61 is diode-connected, so as to function as a diode connected in forward direction from the node N60 to the power line "VSS".

When the transistor TN61 turns on and a current starts flowing from the external terminal P11 to the power line "VSS", a potential difference is generated between both terminals of the resistor R62, that is, between the node N61 and the node N62. When the potentials at the nodes N61 and N62 are given as "V(N61)" and "V(N62)", respectively, the relationship V(N61)>V(N62) is satisfied. The first control circuit 62 supplies a voltage equal to the voltage "V(N61)" of the node N61 to the back gate terminal of the transistor TP62. The second control circuit 63 supplies a voltage equal to the voltage "V(N62)" of the node N62 to the gate terminal of the transistor TP62. Due to the voltages, the transistor TP62 turns on.

When the transistor TP62 turns on, the transistor TN61 is diode-connected and functions as a diode connected in forward direction from the external terminal P11 to the node N60. Due to the above, the step-down circuit 61 generates the internal voltage "VI2" at the node N60 by dividing the input voltage "VI1" at the external terminal P11 by using the resistors R61 through R64. For example, in a case where the resistance values of the resistors R61 and R64 are set to a same value and the resistance values of the resistors R62 and R63 are set to a same value, the step-down circuit 61 generates the internal voltage "VI2", which is a half of the input voltage "VI1", at the node N60.

In the switching circuit 22, the transistor TP22 turns on in response to the internal voltage "VI2" and the gate voltage (=0 V). Due to this, the switching circuit 22 generates the control voltage "VGA" in accordance with the internal voltage "VI2". Similar to the internal voltage "VGA" generated by the voltage control circuit 20 according to the first embodiment, the internal voltage "VGA" is applied to the gate terminal of the transistor TP42, etc., in the interface circuit 11a of FIG. 3.

Therefore, it becomes possible to secure the withstand voltage of the transistors in the interface circuit with the voltage control circuit 60.

Further, when the input voltage "VI1" is an L level, in the switching circuit 22, the diode D22 cuts off the current which is from the capacitor C21 to the step-down circuit 61. Therefore, the switching circuit 22 generates the control voltage "VGA" based on the capacitor C21.

Therefore, similar to the interface circuit 11a with the voltage control circuit 20 (see FIG. 3), the hazard current can be reduced (see FIGS. 12A and 12B).

When the high potential voltage "VD2" is applied

When the high potential voltage "VD2" is applied, by the transistor TN62 connected to the node N63, the potential of the node N63 corresponds to a difference between the high potential voltage "VD2" and the threshold value voltage "Vthn" of the transistor TN62 (="VD2"–"Vthn"). Similarly, the potential of the node N66 corresponds to a difference between the high potential voltage "VD2" and the threshold value voltage "Vthn" of the transistor TN63 (="VD2"–"Vthn").

When the input voltage "VI1", which is higher than the high potential voltage "VD2", is applied to the external terminal P11, due to the capacitance coupling by a parasitic capacitance between the node N63 and the node N61, the potential of the node N63 is increased from the above potential (="VD2"–"Vthn"). The node N63 is connected to a third control circuit 64. The third control circuit 64 includes a transistor TP68 and a transistor TN64 having the respective gate terminals which are connected to the power line "VD2". The source terminal of the transistor TP68 is connected to the node N63, and the transistor TN64 turns on based on the high potential voltage "VD2" which is applied to the gate terminal thereof. Therefore, when the potential of the node N63 is greater than or equal to the potential corresponding to the sum of the high potential voltage "VD2" and the threshold value voltage "Vthp" of the transistor TP68 (="VD2"+"Vthp"), the transistor TP68 turns on and controls the potential increase of the node N63.

When the supply of the high potential voltage "VD2" is stopped, the transistor TN64 of the third control circuit 64 turns off. Therefore, the potential increase at the node N63 is not controlled. The transistor TN61 turns off based on the potential at the source terminal (potential of the node N60) and the potential of the gate terminal (potential of the node N63).

Similarly, the transistor TP61 turns off based on the potential of the source terminal (potential of the node N60) and the potential of the gate terminal (potential of the node N66). By turning off the transistors TN61 and TP61, a current does not flow from the external terminal P11 to the power line "VSS". Then, the potential difference between both terminals of the resistor R62 (potential difference between the node N61 and the node N62) is zero, so that the transistor TP62 turns off. The transistor TP63 turns off because the potential of the source terminal (potential of the node N66) corresponds to a difference between the high potential voltage "VD2" and the threshold value voltage "Vthn" of the transistor TN63 (="VD2"–"Vthn").

When the input voltage "VI1" is an L level, the first control circuit 62 applies the high potential voltage "VD2" to the back gate terminal of the transistor TP62. Similarly, the second control circuit 63 applies the high potential voltage "VD2" to the gate terminal of the transistor TP62. As described above, the potential of the node N63, to which the transistor TP62 is connected, corresponds to the difference between the high potential voltage "VD2" and the threshold value voltage "Vthn" of the transistor TN62 (="VD2"–"Vthn"). Therefore, the transistor TP62 turns off. By doing this, the generation of the current path is prevented from the power line "VD2", to which the drain terminal of the transistor TN62 is connected, to the external terminal P11 via the transistors TN62 and TP62 and the resistor R61.

As described above, according to this embodiment, in addition to the effects of the first embodiment, the following effect can be obtained. (2-1) The switching circuit 22 generates the control voltage "VGA" based on the high potential voltage "VD2" when the high potential voltage "VD2" is applied thereto. Then, in the step-down circuit 61, the transistors TN61 and TP61, which are between the external terminal P11 and the power line "VSS", turn off when the high potential voltage "VD2" is applied thereto. By doing this, the current flow from the external terminal P11 can be cut off, therefore it becomes possible to reduce energy consumption.

Another Embodiment

The above embodiments may be carried out as described below.
In the above embodiments, a semiconductor apparatus having plural interface circuits may be used.

Figure 6:
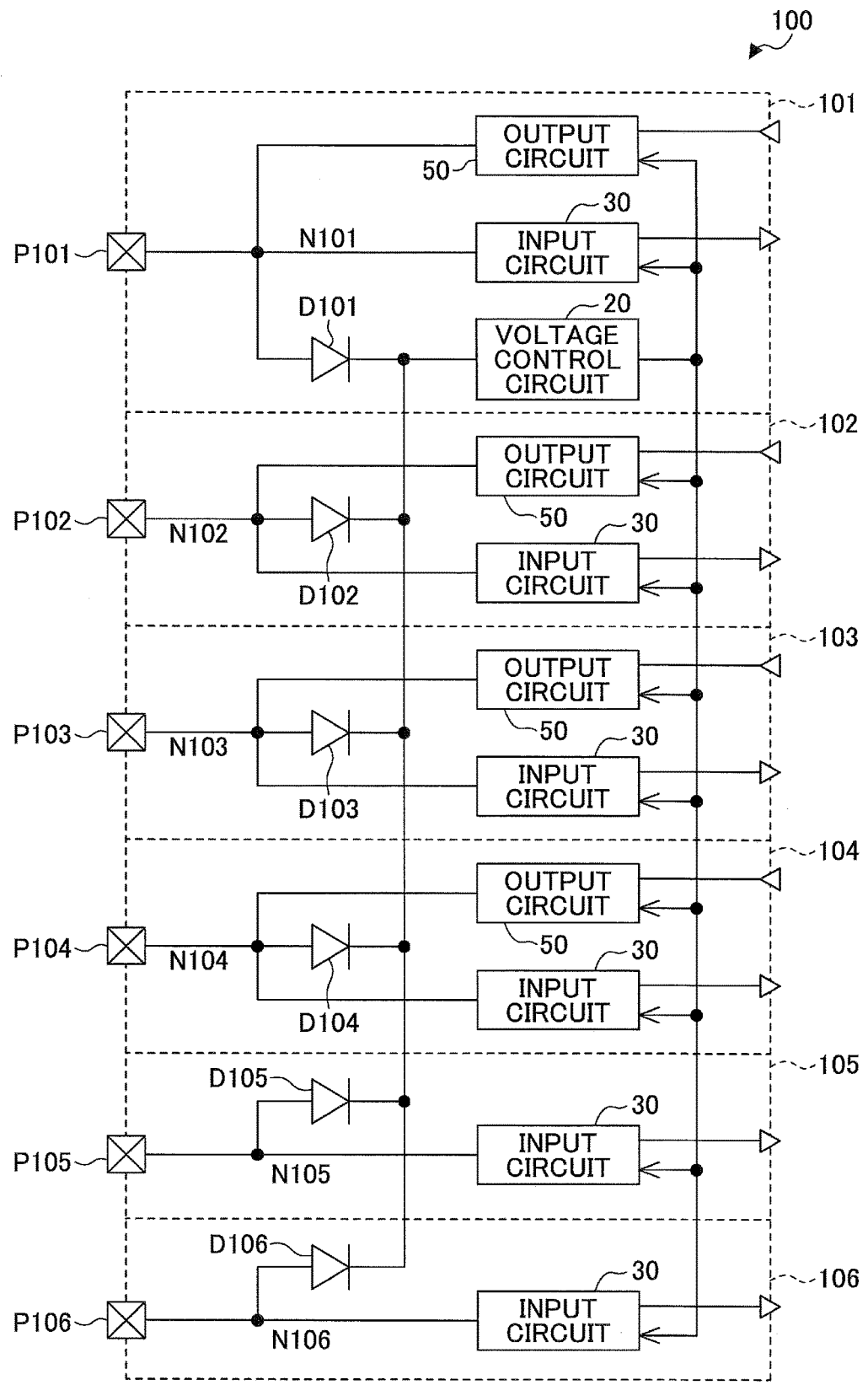
FIG. 6 is a block circuit diagram illustrating another semiconductor apparatus.

A semiconductor apparatus 100 of FIG. 6 includes plural (six in FIG. 6) external terminals P101 through P106 and interface circuits 101 through 106 connected to the external terminals P101 through P106, respectively.

The interface circuits 101 through 104 are input/output circuits including respective output circuits 50 and input circuits 30. The interface circuits 105 and 106 include respective input circuits 30. The output circuits 50 include respective transistors which are connected to nodes N101 through N104 connected to the external terminal P101 through P104. Similarly, the input circuits 30 include respective transistors which are connected to the nodes N101 through N106.

Further, the interface circuit 101 includes the voltage control circuit 20. For example, the voltage control circuit 20 is similar to the voltage control circuit 20 of FIG. 2. Alternatively, the voltage control circuit 20 may be similar to the voltage control circuit 60 of FIG. 5.

The interface circuit 101 includes a diode D101. The anode of the diode D101 is connected to the node N101, and the cathode of the diode D101 is connected to the voltage control circuit 20. Similarly, the interface circuits 102 through 106 include respective diodes D102 through D106. The anodes of the diodes D102 through D106 are connected to the nodes N102 through N106, respectively, and the cathodes of the diodes D102 through D106 are connected to the voltage control circuit 20 in the interface circuit 101.

Therefore, the voltage control circuit 20 generates the control voltage "VGA" based on the highest voltage among the input voltages at the nodes N101 through N106. The control voltage "VGA" is applied to the control terminals of the transistors included in the output circuit 50 and the input circuit 30 of the interface circuit 101. Similarly, the control voltage "VGA" is applied to the control terminals of the transistors included in the output circuits 50 and the input circuit 30s of the interface circuits 102 through 104. Further, the control voltage "VGA" is applied to the control terminals of the transistors included in the input circuits 30 of the interface circuits 105 and 106.

In such a semiconductor apparatus 100, it becomes possible to control the increase of the chip area of the semiconductor apparatus 100 when compared with a case where the voltage control circuit 20 is provided in each of the interface circuits 102 through 106. Further, the voltage control circuit 20 generates the control voltage "VGA" based on the highest voltage, that is, the input voltage that has been increased to an H level faster than any other input voltages among the input voltages at the node N101 through N106. Therefore, there may be a case where the timing when the control voltage "VGA" is applied to the control terminals of the transistors in the interface circuits 102 through 106 is earlier than the timing when control voltages "VGA", provided in the respective interface circuits 102 through 106 are applied to the control terminals of the transistors in the interface circuits 102 through 106. Therefore, it becomes possible to reduce a delay until the withstand voltage is secured caused by the delay of the control voltage "VGA" due to a difference of the circuit operation speeds.

In the above embodiments, the semiconductor apparatuses 11 and 12 operate based on the high potential voltage "VD2" (see FIG. 1). Alternatively, a semiconductor may be provided that includes a circuit which operates based on the high potential voltage "VD2" (e.g., the above interface circuit) and a circuit which operates based on the high potential voltage "VD1" or another high potential voltage. Further, the supply of the high potential voltage "VD2" may be cut off to stop a part of the circuits in the semiconductor apparatus to reduce energy consumption.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of superiority or inferiority of the invention. Although the embodiments of the present invention have been described in detail, it is to be understood that various changes, substitutions, and alterations could be made hereto without departing from the spirit and scope of the invention.

What is claimed is:
1. A semiconductor apparatus comprising:
an internal circuit connected to a first power line to which a first power voltage is applied;
a transistor including a first terminal, which is connected to a node to which an input voltage is applied, a second terminal connected to the internal circuit, and a control teiininal to which a control voltage is applied; and
a voltage control circuit, which is connected to the node, configured to generate the control voltage,
wherein the voltage control circuit includes:
a step-down circuit configured to generate an internal voltage by lowering the input voltage applied to the node, and
a switching circuit, which is connected to the first power line and the control terminal of the transistor, configured to generate the control voltage applied to the control terminal of the transistor, the control voltage being based on the first power voltage when the first power voltage is supplied and being based on the internal voltage when the first power voltage is not supplied.
2. The semiconductor apparatus according to claim 1, wherein the switching circuit includes:
a first diode having an anode to which the internal voltage is applied, a capacitor having a first terminal connected to a cathode of the first diode and a second terminal connected to a second power line to which a second power voltage is applied, a p-channel MOS transistor having a first terminal connected to the first terminal of the capacitor and a control terminal connected to the first power line, and a second diode having an anode connected to the first power line and a cathode connected to a second terminal of the p-channel MOS transistor, and wherein the cathode of the second diode outputs the control voltage.

3. The semiconductor apparatus according to claim 1, wherein the step-down circuit includes:

first and second resistors connected to each other in series between the node and a second power line to which a second power voltage is applied, a first p-channel MOS transistor, which is connected between the first resistor and the second resistor, having a control terminal to which the internal voltage is applied, and a diode having an anode connected to a connection node where the first p-channel MOS transistor is connected to the second resistor and a cathode to output the internal voltage.

4. The semiconductor apparatus according to claim 1, wherein the step-down circuit includes:

first, second, third, and fourth resistors which are connected in series between the node and a second power line to which a second power voltage is applied, a first n-channel MOS transistor connected between an output node to generate the internal voltage and the second resistor, a second n-channel MOS transistor, which is connected between a control terminal of the first n-channel MOS transistor and the first power line, having a control terminal connected to the first power line, a first p-channel MOS transistor connected between the output node and the third resistor, a third n-channel MOS transistor, which is connected between a control terminal of the first p-channel MOS transistor and the first power line, having a control terminal connected to the first power line, a second p-channel MOS transistor connected between a first node, where the first resistor and the second resistor are connected, and a control terminal of the first n-channel MOS transistor, a first control circuit, which is connected to the first node, configured to apply a voltage of the first node or the first power voltage, whichever is greater, to a back gate terminal of the second p-channel MOS transistor, a second control circuit, which is connected to a second node where the second resistor and the first n-channel MOS transistor are connected, configured to apply a voltage of the second node or the first power voltage, whichever is greater, to a control terminal of the second p-channel MOS transistor, a third p-channel MOS transistor, which is connected between a third node where the third resistor and the fourth resistor are connected and a control terminal of the first p-channel MOS transistor, having a control terminal connected to the first power line, and a fourth p-channel MOS transistor and a fourth n-channel MOS transistor, which are connected in series between the control terminal of the first n-channel MOS transistor and the second power line, having respective control terminals connected to the first power line.

5. The semiconductor apparatus according to claim 1, further comprising a protection circuit connected to the node, wherein the protection circuit includes:

a first transistor having a first terminal connected to the node and a control terminal to which the control voltage is applied, a second transistor having a first terminal connected to a second terminal of the first transistor, a second terminal connected to the first power line, and a control terminal to which the input voltage is applied, and a third transistor having a control terminal connected to the second terminal and a back gate terminal of the first transistor and the first terminal and a back gate terminal of the second transistor, a first terminal connected to the node, a second terminal connected to the first power line, and a back gate terminal connected to the second terminal of the first transistor.

6. The semiconductor apparatus according to claim 5, wherein the protection circuit further includes:

a fourth transistor having a first terminal connected to the node and a control terminal to which the control voltage is applied, and a fifth transistor, which is connected between a second power line to which a second power voltage is applied and a second terminal of the fourth transistor, having a control terminal connected to the second power line.

7. The semiconductor apparatus according to claim 5, wherein the internal circuit includes an output circuit, wherein the output circuit includes an output transistor having a first terminal connected to the node, a second terminal connected to the first power line, a control terminal to which a signal corresponding to an output signal and an enable signal is supplied, and a back gate terminal connected to the back gate terminal of the third transistor of the protection circuit, and wherein a second terminal of the transistor is connected to the control terminal of the output transistor, and a back gate terminal of the transistor is connected to the back gate terminal of the output transistor.

8. The semiconductor apparatus according to claim 1, wherein the internal circuit includes an input circuit, and wherein a second terminal of the transistor is connected to an input terminal of the input circuit.

9. The semiconductor apparatus according to claim 7, wherein the internal circuit includes:

an input circuit, and a sixth transistor having a first terminal connected to the node, a second terminal connected to an input terminal of the input circuit, and a control terminal to which the control voltage is applied.

10. The semiconductor apparatus according to claim 1, comprising:

a plurality of nodes to which input voltages different from each other are input;

a plurality of diodes having respective anodes connected to the nodes; and a plurality of the transistors having respective first terminals connected to the nodes, wherein the voltage control circuit is connected to cathodes of the diodes and is configured to generate the control voltage based on the input voltages applied to the nodes, and wherein the control voltage generated by the voltage control circuit is applied to control terminals of the transistors connected to the nodes.

11. A semiconductor apparatus comprising:
an internal circuit connected to a first power line to which a first power voltage is applied;
a transistor including a first terminal, which is connected to a node to which an input voltage is applied, a second terminal connected to the internal circuit, and a control terminal to which a control voltage is applied; and
a voltage control circuit, which is connected to the node, configured to generate the control voltage,
wherein the voltage control circuit includes:
a step-down circuit configured to generate an internal voltage by lowering the input voltage applied to the node, and
a switching circuit, which is connected to the first power line, configured to generate the control voltage based on the first power voltage and being based on the internal voltage,
wherein the switching circuit includes:
a first diode having an anode to which the internal voltage is applied,
a capacitor having a first terminal connected to a cathode of the first diode and a second terminal connected to a second power line to which a second power voltage is applied,
a p-channel MOS transistor having a first terminal connected to the first terminal of the capacitor and a control terminal connected to the first power line, and
a second diode having an anode connected to the first power line and a cathode connected to a second terminal of the p-channel MOS transistor, and
wherein the cathode of the second diode outputs the control voltage.

12. The semiconductor apparatus according to claim 11, wherein the step-down circuit includes:
first and second resistors connected to each other in series between the node and a second power line to which a second power voltage is applied,
a first p-channel MOS transistor, which is connected between the first resistor and the second resistor, having a control terminal to which the internal voltage is applied, and
a diode having an anode connected to a connection node where the first p-channel MOS transistor is connected to the second resistor and a cathode to output the internal voltage.

13. The semiconductor apparatus according to claim 11, wherein the step-down circuit includes:
first, second, third, and fourth resistors which are connected in series between the node and a second power line to which a second power voltage is applied,
a first n-channel MOS transistor connected between an output node to generate the internal voltage and the second resistor,
a second n-channel MOS transistor, which is connected between a control terminal of the first n-channel MOS transistor and the first power line, having a control terminal connected to the first power line,
a first p-channel MOS transistor connected between the output node and the third resistor,
a third n-channel MOS transistor, which is connected between a control terminal of the first p-channel MOS transistor and the first power line, having a control terminal connected to the first power line,
a second p-channel MOS transistor connected between a first node, where the first resistor and the second resistor are connected, and a control terminal of the first n-channel MOS transistor,
a first control circuit, which is connected to the first node, configured to apply a voltage of the first node or the first power voltage, whichever is greater, to a back gate terminal of the second p-channel MOS transistor,
a second control circuit, which is connected to a second node where the second resistor and the first n-channel MOS transistor are connected, configured to apply a voltage of the second node or the first power voltage, whichever is greater, to a control terminal of the second p-channel MOS transistor,
a third p-channel MOS transistor, which is connected between a third node where the third resistor and the fourth resistor are connected and a control terminal of the first p-channel MOS transistor, having a control terminal connected to the first power line, and
a fourth p-channel MOS transistor and a fourth n-channel MOS transistor, which are connected in series between the control terminal of the first n-channel MOS transistor and the second power line, having respective control terminals connected to the first power line.

14. The semiconductor apparatus according to claim 11, wherein the internal circuit includes an input circuit, and
wherein a second terminal of the transistor is connected to an input terminal of the input circuit.

15. A semiconductor apparatus comprising:
an internal circuit connected to a first power line to which a first power voltage is applied;
a transistor including a first terminal, which is connected to a node to which an input voltage is applied, a second terminal connected to the internal circuit, and a control terminal to which a control voltage is applied; and
a voltage control circuit, which is connected to the node, configured to generate the control voltage,
wherein the voltage control circuit includes:
a step-down circuit configured to generate an internal voltage by lowering the input voltage applied to the node,
a switching circuit, which is connected to the first power line, configured to generate the control voltage based on the first power voltage and the internal voltage, and
a protection circuit connected to the node; and
wherein the protection circuit includes:
a first transistor having a first terminal connected to the node and a control terminal to which the control voltage is applied,
a second transistor having a first terminal connected to a second terminal of the first transistor, a second terminal connected to the first power line, and a control terminal to which the input voltage is applied, and
a third transistor having a control terminal connected to the second terminal and a back gate terminal of the first transistor and the first terminal and a back gate terminal of the second transistor, a first terminal connected to the node, a second terminal connected to the first power line, and a back gate terminal connected to the second terminal of the first transistor.

16. The semiconductor apparatus according to claim 15, wherein the protection circuit further includes:
a fourth transistor having a first terminal connected to the node and a control terminal to which the control voltage is applied, and
a fifth transistor, which is connected between a second power line to which a second power voltage is applied and a second terminal of the fourth transistor, having a control terminal connected to the second power line.

17. The semiconductor apparatus according to claim 15,
wherein the internal circuit includes an output circuit,
wherein the output circuit includes an output transistor having a first terminal connected to the node, a second terminal connected to the first power line, a control tetiuinal to which a signal corresponding to an output signal and an enable signal is supplied, and a back gate terminal connected to the back gate terminal of the third transistor of the protection circuit, and
wherein a second terminal of the transistor is connected to the control terminal of the output transistor, and a back gate terminal of the transistor is connected to the back gate terminal of the output transistor.

18. The semiconductor apparatus according to claim 15,
wherein the internal circuit includes an input circuit, and
wherein a second terminal of the transistor is connected to an input terminal of the input circuit.

19. The semiconductor apparatus according to claim 17, wherein the internal circuit includes:
an input circuit, and
a sixth transistor having a first terminal connected to the node, a second terminal connected to an input terminal of the input circuit, and a control terminal to which the control voltage is applied.

* * * * *

UNITED STATES PATENT AND TRADEMARK OFFICE
CERTIFICATE OF CORRECTION

| | | |
|---|---|---|
| PATENT NO. | : 9,853,636 B2 | Page 1 of 1 |
| APPLICATION NO. | : 14/741911 | |
| DATED | : December 26, 2017 | |
| INVENTOR(S) | : Hajime Ohmi et al. | |

It is certified that error appears in the above-identified patent and that said Letters Patent is hereby corrected as shown below:

In the Claims

Claim 1, Column 18, Line 49 reads: teiininal to which a control voltage is applied; and
Should read: terminal to which a control voltage is applied; and Claim 17, Column 23, Line 8 reads: tetiuinal to which a signal corresponding to an output
Should read: terminal to which a signal corresponding to an output Signed and Sealed this
Third Day of April, 2018

Andrei Iancu
*Director of the United States Patent and Trademark Office*